United States Patent [19]

O'Connor et al.

[11] Patent Number: 5,893,763
[45] Date of Patent: Apr. 13, 1999

[54] TRANSITION ADAPTER FOR CONDUCTOR CABLES

[75] Inventors: Michael R. O'Connor, Seymour; Robert A. Aekins, Stratford, both of Conn.

[73] Assignee: Hubbell Incorporated, Orange, Conn.

[21] Appl. No.: 08/724,237

[22] Filed: Sep. 30, 1996

[51] Int. Cl.$^6$ .................................................. H01R 9/09
[52] U.S. Cl. ............................................ 439/76.1; 439/532
[58] Field of Search .............................. 439/76.1, 709, 439/719, 532, 404, 49

[56] References Cited

U.S. PATENT DOCUMENTS

| | | | |
|---|---|---|---|
| 4,595,799 | 6/1986 | Krob et al. | 439/55 |
| 4,767,338 | 8/1988 | Dennis et al. | 439/76.1 |
| 5,309,121 | 5/1994 | Kobayashi et al. | 439/76.1 |
| 5,459,643 | 10/1995 | Siemon et al. | 439/785 |
| 5,575,665 | 11/1996 | Shramawick et al. | 439/49 |
| 5,645,445 | 7/1997 | Siemon et al. | 439/395 |
| 5,649,829 | 7/1997 | Miller et al. | 439/76.1 |

*Primary Examiner*—Steven L. Stephan
*Assistant Examiner*—T C Patel
*Attorney, Agent, or Firm*—Jerry M. Presson; Mark S. Bicks

[57] ABSTRACT

A transition adapter connects two different multi-conductor cables. The adapter includes a board holder, a printed circuit board mounted on the board holder, and input and output connectors mounted on the circuit board. The board holder has a base member and wall members extending from opposite edges of the base member. The printed circuit board has input contact areas, output contact areas and conductor traces connecting the respective contact areas. Each connector has a plurality of contacts, with each contact having a wire receiving portion and a terminal portion. The terminal portions engage and are connected to the contact areas on the circuit board. By connecting the conductors of the cables to the contact wire receiving portions, the two cables are properly connected to each other.

15 Claims, 3 Drawing Sheets

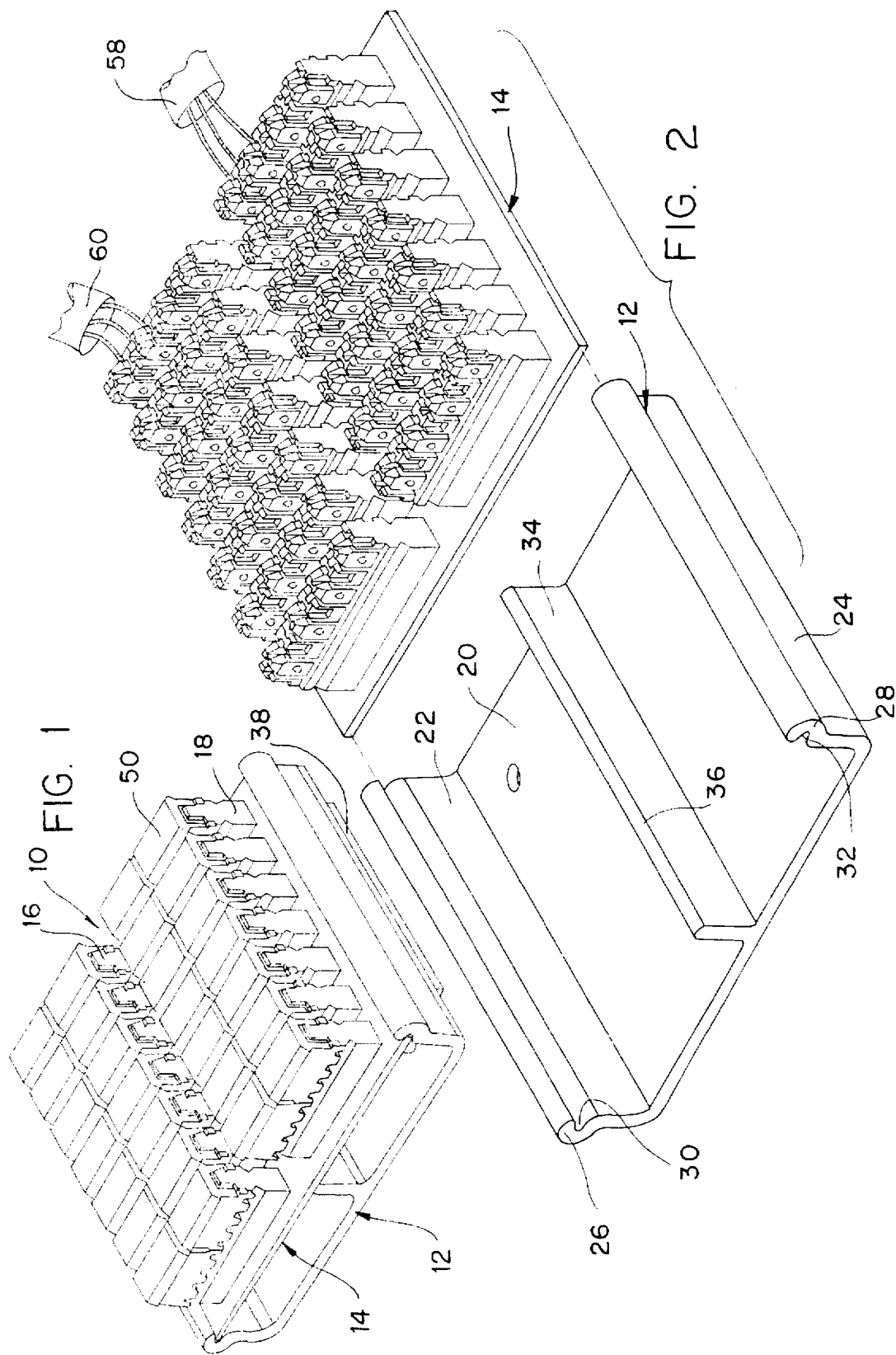

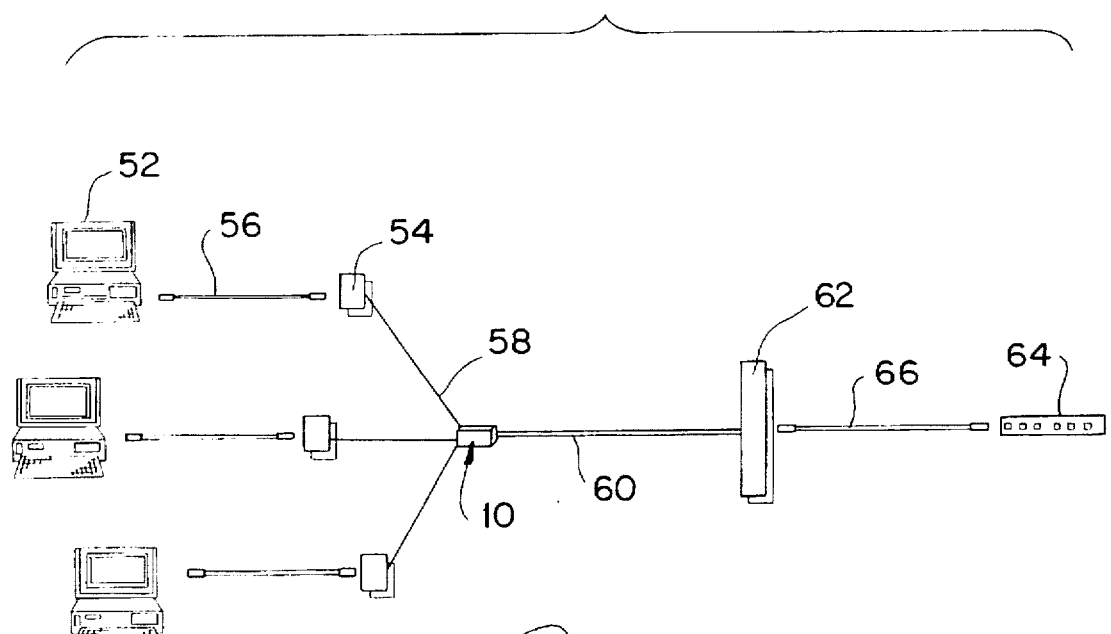
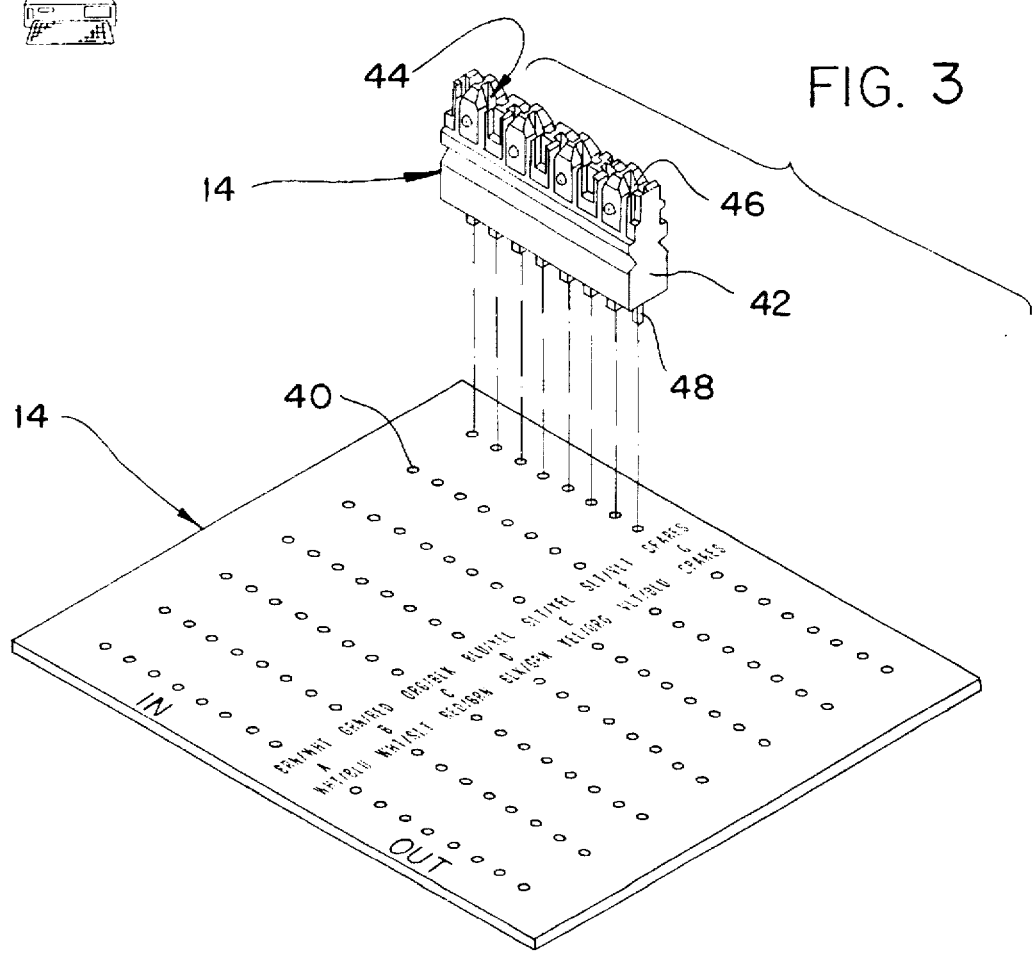

5,893,763

TRANSITION ADAPTER FOR CONDUCTOR CABLES

REFERENCE TO RELATED APPLICATION

This application is related to U.S. patent application Ser. No. 08/724,255, now U.S. Pat. No. 5,741,157 entitled Raceway System With Transition Adapter and concurrently filed herewith, the subject matter of which is hereby incorporated by reference.

FIELD OF THE INVENTION

The present invention relates to a transition adapter for electrically connecting two different multiple conductor cables. More particularly, the present invention relates to a transition adapter for telecommunication systems having a board holder, a printed circuit board mounted on the board holder, and connectors mounted on and electrically connected by the circuit board for receiving the conductors of the cables.

BACKGROUND OF THE INVENTION

Computer work stations must be connected to cables for receiving voice and data communications. For multiple station installations in a single room, the wiring passing through and along walls comprises round conductor cables having a plurality, usually four pairs, of twisted unshielded conductors extending through the round conductor cables. From the wall, wiring is in the form of flat conductor undercarpet cables which pass from the building pathways, in or along the walls, into the open office or work space environments.

In wiring the various terminals, the two cables must be simply and effectively joined in a manner which does not create significant crosstalk. Additionally, the system must be highly adaptable for different work place layouts and to permit work place layouts to be changed or modified.

In typical installations, a plurality of terminals are located in a work space. Each terminal is connected to an outlet adjacent to the work station through a conventional patch cord. The outlets are connected by undercarpet or flat cables to a transition point where the undercarpet cables are connected to round conductor cables. The round cables pass through or along walls to a cross-connect patch panel. The cross-connect patch panel is then connected to an interface equipment station through a patch cord.

SUMMARY OF THE INVENTION

An object of the present invention is to provide a transition adapter for connecting two different multiple conductor cables which is simple and inexpensive to manufacture and is simple to install and connect with the appropriate cables.

Another object of the present invention is to provide a transition adapter for connecting two different multiple conductor cables which at least satisfies the requirements for Category 5 and which reduces crosstalk.

The foregoing objects are basically obtained by a transition adapter for connecting two different multiple conductor cables, comprising a board holder, a printed circuit board mounted on the board holder and input and output connectors mounted on the circuit board. The board holder has a base member and wall members extending from opposite edges of the base member. The printed circuit board has input contact areas, output contact areas and conductive traces connecting each of the input contact areas with the respective output contact area. The input and output connectors have input contacts and output contacts, respectively. Each of the contacts are parallel and have a wire receiving portion and a terminal portion. The terminal portions of the input contacts engage the input contact areas. The terminal portions of the output contacts engage the output contact areas.

By forming the transition adapter in this manner, the conductors from each cable can be easily and quickly terminated in a clearly identified connector and portion thereof. The adapter is simple and inexpensive to manufacture. The conductive traces on the circuit board can be formed in a manner, along with the contact arrangement, which reduces crosstalk.

Other objects, advantages and salient features of the present invention will become apparent from the following detailed description, which, taken in conjunction with the annexed drawings, discloses a preferred embodiment of the present invention.

BRIEF DESCRIPTION OF THE DRAWINGS

Referring to the drawings which form a part of this disclosure:

FIG. 1 is a perspective view of a transition adapter according to the present invention;

FIG. 2 is an exploded, perspective view of the transition adapter FIG. 1 with the connector caps removed;

FIG. 3 is a partial, perspective view of one connector and the circuit board of the transition adapter of FIG. 1;

FIG. 6 is a graphical illustration of a voice and/or data transmission system employing the transition adapter of FIG. 1 according to the present invention.

DETAILED DESCRIPTION OF THE INVENTION

Figure 4:
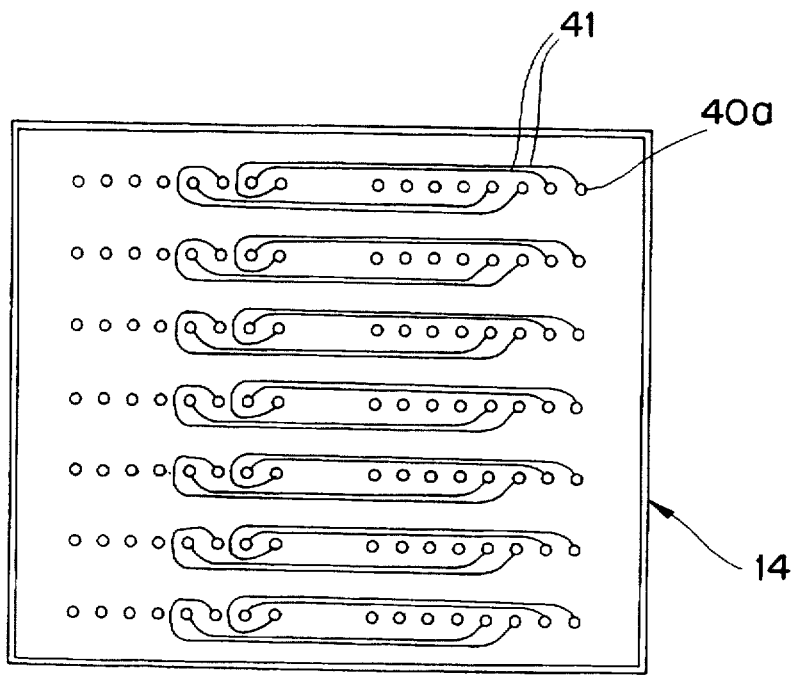
FIG. 4 is a top plan view of the circuit board of the transition adapter of FIG. 1 illustrating the conductive traces on the top surface or connector side of the circuit board.

The transition adapter 10 according to the present invention and as illustrated in FIGS. 1–5 comprises a board holder 12, a printed circuit board 14 mounted on the board holder, and input and output connectors 16 and 18, respectively, mounted on the circuit board. The transition adapter connects the respective conductors in two different multiconductor cables by means of the contacts within the input and output conductors and conductive traces formed on the circuit board connecting the contacts of the connectors.

As best illustrated in FIG. 2, board holder 12 comprises a substantially planar base member 20 of rectangular configuration. Wall members 22 and 24 extend perpendicularly from opposite side edges of base member 20. Wall members 22 and 24 have C-shaped sections 26 and 28 extending along the lengths of the free edges of the wall members remote from the base member. The inner surfaces of the C-shaped sections 28 and 26 define grooves 30 and 32, respectively, which face one another and are spaced from the base member for receiving opposite edges of circuit board 14.

A support member 34 extends upwardly and perpendicularly from base member 20 equally spaced from and parallel to wall members 22 and 24. The support member has a free end 36 remote from base member 20 for engaging and supporting a surface of circuit board 14.

A strip of tape 38 is provided on the exterior surface of base member 20, i.e., the surface opposite the surface thereof from which the wall members and support member extend. Tape 38 has adhesive on both sides for adhering and mounting the board member to another panel, such as the wall of a raceway wiring or device box.

Figure 5:
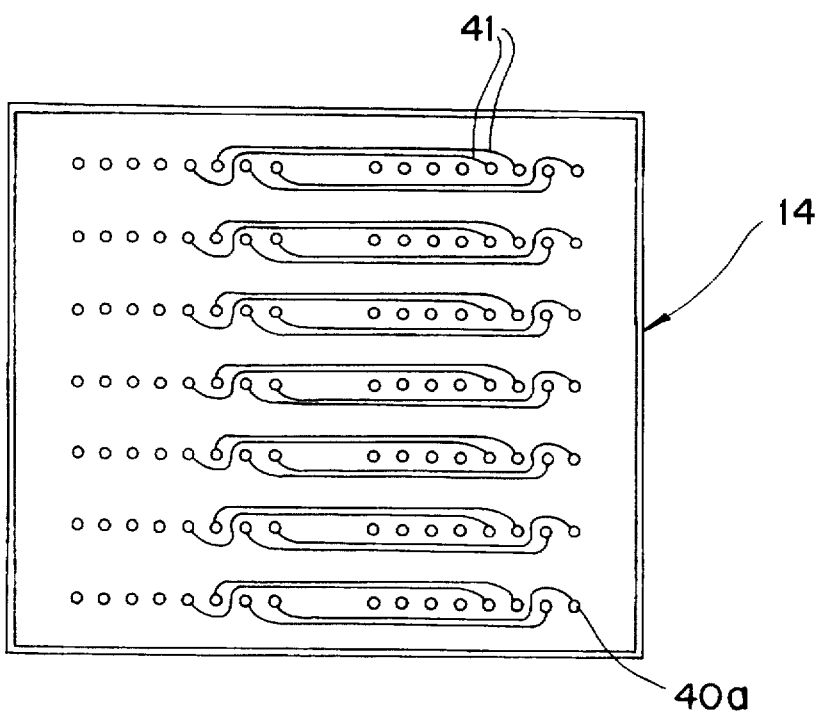
FIG. 5 is a bottom plan view of the circuit board of the transition adapter of FIG. 1 illustrating the conductive traces on the bottom surface or solder side of the circuit board.

Printed circuit board 14 comprises a planar, rectangular base of dielectric material. For each connector in the illustrated embodiment, the board has a series of through holes 40. The holes are arranged in groups of eight, for each connector, oriented along a single straight line. For the seven input connectors 16 and the seven output connectors 18, there are 14 sets of holes. Each hole is plated with copper plating with a solder coating constituting 50 to 70 percent tin. Additionally, around each hole is a pad 40a of conductive material having a diameter larger than the drilled hole. The plated through holes and pads form contact areas for the connectors. Printed circuit board traces 41 are provided on circuit board 14 to connect each input hole with the respective output hole, as illustrated in FIGS. 4 and 5.

The conductive traces on the circuit board are arranged to reduce crosstalk. Such arrangements can be formed according to the teachings of U.S. Pat. No. 5,432,484 to Klas et al, entitled Connector for Communication Systems with Canceled Crosstalk and issued Jul. 11, 1995, and U.S. Pat. No. 5,414,393 to Rose et al, entitled Telecommunication Connector with Feedback and issued May 9, 1995, the subject matters of which are hereby incorporated by reference.

Suitable legends are provided on the circuit board to clearly identify the respective connectors connected or mounted on the circuit board. The legends are located in board areas which are exposed when the connectors are mounted thereon. These exposed legends facilitate installation and connection of the appropriate conductor cables.

Since each connector is formed of identical configuration, only one will be described in detail. Each input and output connector is of conventional design having a plastic body 42 with a contact support and conductor guide structure formed therein. The contacts 44 supported and received within body 42 are of the 110D type laid out in a continuous, parallel fashion to maintain a crosstalk value of greater than −40 dB.

Each contact has a wire receiving portion 46 and a depending terminal portion 48. The wire receiving portions receive the individual conductors from the cables pierce the insulation on the individual conductors and directly engage the individual conductors in the pierced insulation, as known for 110D type contacts and as graphically illustrated in FIG. 2. Terminal portions 48 are fitted within holes 40 and make electrical contact with the circuit board conductive pads and traces.

After the appropriate cable conductors are placed within the respective wire receiving portions, conventional caps 50 are attached on the end of conductor body 42 remote from terminal portions 48. The caps secure the cable conductors within the respective cable receiving portions of the connectors 42.

A typical use of the transition adapter of the present invention is graphically illustrated in FIG. 6. Computer terminals 52 are connected to modular jacks 54 by patch cords 56. The individual jacks 54 are connected to a transition adapter 10 according to the present invention by flat undercarpet cables 58. The undercarpet cable is of the type usually housing four unshielded twisted pairs of conductors. The conductors of cables 58 are connected to the output connectors 18 of transition adapter 10. Round cables 60 have their individual conductors connected with the respective portions of the respective input connectors 16. The opposite end of the round cable 60 are connected to a cross-connect patch panel 62. Patch panel 62 is connected to interface station equipment 64 by a patch cord 66. In this manner, the connection of the two different types of cable, flat cable 56 and round cable 60, is facilitated through the transition adapter according to the present invention.

The round cable 60 extends through the normal building passways within and/or along the building walls. The flat cable 58 extends across open areas, typically under carpet.

While a particular embodiment has been chosen to illustrate the invention, it will be understood by those skilled in the art that various changes and modifications can be made therein without departing from the scope of the invention as defined in the appended claims.

What is claimed is:

1. A transition adapter for connecting two different multiple conductor cables, comprising:

a board holder having a base member, wall members extending from opposite edges of said base member, and a central support extending from said base member and between and substantially parallel to said wall members, said center support having a free end remote from said base member, said wall members having elongated grooves facing one another and spaced from said base member;

a generally rectangular printed circuit board mounted on said board holder and having first input contact areas, first output contact areas and first conductive traces connecting each of said first input contact areas with the respective first output contact areas, one pair of opposite side edges on said printed circuit board being slidably engaged in said grooves in said wall members, a central portion of said printed circuit board supported by said central support; and a first input connector and a first output connector mounted on said circuit board and having first input contacts and first output contacts, respectively, each of said contacts being parallel and having a wire receiving portion and a terminal portion, said wire receiving portions forming insulation piercing sections for piercing insulation on individual conductors of the cables and directly engaging the individual conductors in the pierced insulation, said terminal portions of said first input contacts engaging said first input contact areas, said terminal portions of said first output contacts engaging said first output contact areas.

2. A transition adapter according to claim 1 wherein each of said contacts are substantially coplanar.

3. A transition adapter according to claim 1 wherein said circuit board has second input contact areas, second output contact areas and second conductive traces connecting each of said second input contact areas with the respective second output contact area; and a second input connector and a second output connector are mounted on said circuit board and have second input contacts and second output contacts, respectively, each of said second contacts being parallel and having a wire receiving portion and a terminal portion, said wire receiving portions of said second input and output contacts forming insulation piercing sections for piercing insulation on individual conductors of the cables and directly engaging the individual conductors in the pierced insulation, said terminal portions of said second input contacts engaging said second input contact areas, said terminal portions of said second output contacts engaging said second output contact areas.

4. A transition adapter according to claim 3 wherein each of said second contacts are substantially coplanar, and are located in a plane parallel to said first contacts.

5. A transition adapter according to claim 2 wherein said circuit board has third input contact areas, third output contact areas and third conductive traces connecting each of said third input contact areas with the respective third output contact area; and a third input connector and a third output connector are mounted on said circuit board and have third input contacts and third output contacts, respectively, each of said third contacts being parallel and having a wire receiving portion and a terminal portion, said wire receiving portions of said third input and output contacts forming insulation piercing sections for piercing insulation on individual conductors of the cables and directly engaging the individual conductors in the pierced insulation, said terminal portions of said third input contacts engaging said third input contact areas, said terminal portions of said third output contacts engaging said third output contact areas.

6. A transition adapter according to claim 5 wherein each of said second and third contacts are substantially coplanar in respective parallel planes parallel to said first contacts.

7. A transition adapter according to claim 1 wherein said base member of said board holder comprises means for mounting said board holder on a panel.

8. A transition adapter according to claim 1 wherein said circuit board has an outer periphery entirely located between and within an area defined between said wall members.

9. A transition adapter for connecting two different multiple conductor cables, comprising:

a board holder having a base member, wall members extending from opposite edges of said base member, and a central support extending from said base member and between and substantially parallel to said wall members, said center support having a free end remote from said base member, said wall members having elongated grooves facing one another and spaced from said base member;

a generally rectangular printed circuit board mounted on said board holder between said wall members and having first input contact areas, first output contact areas and first conductive traces connecting each of said first input contact areas with the respective first output contact areas, said circuit board being located entirely within said board holder, one pair of opposite side edges on said printed circuit board being slidably engaged in said grooves in said wall members, a central portion of said printed circuit board being supported by said central support; and a first input connector and a first output connector mounted on said circuit board and having first input contacts and first output contacts, respectively, each of said contacts being parallel and having a wire receiving portion and a terminal portion, said terminal portions of said first input contacts engaging said first input contact areas, said terminal portions of said first output contacts engaging said first output contact areas.

10. A transition adapter according to claim 9 wherein each of said contacts are substantially coplanar.

11. A transition adapter according to claim 9 wherein said circuit board has second input contact areas, second output contact areas and second conductive traces connecting each of said second input contact areas with the respective second output contact area; and a second input connector and a second output connector are mounted on said circuit board and have second input contacts and second output contacts, respectively, each of said second contacts being parallel and having a wire receiving portion and a terminal portion, said terminal portions of said second input contacts engaging said second input contact areas, said terminal portions of said second output contacts engaging said second output contact areas.

12. A transition adapter according to claim 11 wherein each of said second contacts are substantially coplanar, and are located in a plane parallel to said first contacts.

13. A transition adapter according to claim 10 wherein said circuit board has third input contact areas, third output contact areas and third conductive traces connecting each of said third input contact areas with the respective third output contact area; and a third input connector and a third output connector are mounted on said circuit board and have third input contacts and third output contacts, respectively, each of said third contacts being parallel and having a wire receiving portion and a terminal portion, said terminal portions of said third input contacts engaging said third input contact areas, said terminal portions of said third output contacts engaging said third output contact areas.

14. A transition adapter according to claim 13 wherein each of said second and third contacts are substantially coplanar in respective parallel planes parallel to said first contacts.

15. A transition adapter according to claim 9 wherein said base member of said board holder comprises means for mounting said board holder on a panel.

* * * * *